June 9, 1959 P. E. MURFIN 2,890,295
LOW FREQUENCY AMPLIFIER
Filed Oct. 29, 1957
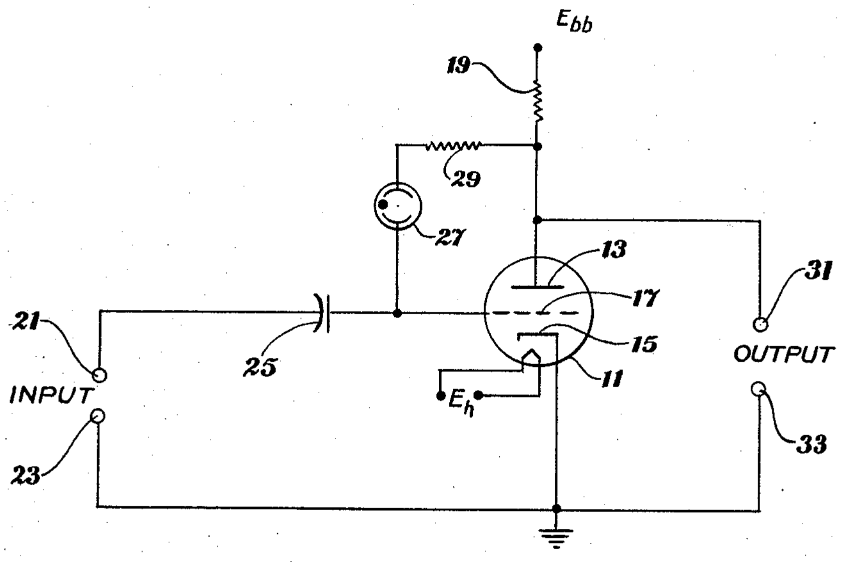
Paul E. Murfin
INVENTOR.
BY G. W. O'Brien
W. O. Quesenbury
ATTORNEYS United States Patent Office 2,890,295

Patented June 9, 1959

2,890,295

LOW FREQUENCY AMPLIFIER

Paul E. Murfin, Rochester, N.Y., assignor, by mesne assignments, to the United States of America as represented by the Secretary of the Navy Application October 29, 1957, Serial No. 693,218

2 Claims. (Cl. 179—171)

This invention relates to an amplifier and more particularly to an amplifier offering high impedance to a low frequency input signal source.

The amplifier of the present invention was designed as a result of a need for an amplifier having a higher input impedance than the known conventional triode amplifiers, and comprises a capacitor for coupling the source of input signals to the grid of an electron discharge tube, means providing a discharge path for the capacitor from the grid to the plate of the tube, and means for rendering the discharge path conductive only when the amplifier is paralyzed as a result of a charge on the capacitor. The term "paralyzed" as used in the specification and claims is intended to define the condition of the amplifier which exists when the negative voltage on the control grid is of such a magnitude that the plate current of the electron discharge tube is reduced nearly to zero. The input impedance of the amplifier according to the present invention is limited solely by the leakage resistance of the tube, the wiring, and by the input capacity and stray capacity of the input circuit. Since there is no cathode resistor to cause degeneration, the gain of the amplifier is not reduced as is the case with the conventional triode amplifiers. The amplifier of the present invention has the further advantage of not becoming paralyzed when the power is first turned on, nor when a transient is applied to the plate supply line or to the heater supply line, nor when severe overloading by the input signal occurs. The performance of the amplifier of the present invention is not impaired by wide tolerances on the resistors and on the capacitor and is not critical with respect to tolerances on the plate supply voltage and the heater supply voltage.

The primary object of the present invention is, therefore, to provide an amplifier offering high impedance to a low frequency input signal source.

Another object of the present invention is to provide an amplifier offering a high impedance to a low frequency input signal source in which a capacitor is utilized to interconnect the source of input signals and the control grid of the electron discharge tube, and a discharge circuit comprising a cold cathode gas tube is interconnected between said control grid and the plate of said tube.

Still another object of the present invention is to provide an amplifier offering a high impedance to a low frequency input signal source and comprising a capacitor for coupling the source of input signals to the grid of an electron discharge tube, means providing a discharge path for the capacitor from the grid to the plate of the tube and means for rendering the discharge path conductive only when the amplifier is paralyzed as a result of a charge on the capacitor.

Yet another object of the present invention is to provide an amplifier offering high impedance to a low frequency input signal source which consists of a relatively small number of components and which is simple and relatively inexpensive to manufacture.

Still other objects and advantages of the present invention will become readily apparent to those skilled in the art from the following description with reference to the drawing in which the sole figure is a schematic wiring diagram illustrating the low frequency amplifier of the present invention.

The low frequency amplifier of the present invention comprises a vacuum tube such as for example, triode 11 having a plate 13, cathode 15 and control grid 17. The source (not shown) of plate supply voltage $E_{bb}$ is connected through the plate load resistor 19 across the plate and cathode in the conventional manner. A source (not shown) of low frequency input signals is connected to the terminals 21 and 23 through the coupling capacitor 25 and to the control grid 17 of the tube 11. A discharge circuit for the capacitor 25 is connected between the grid 17 and the plate 13 and comprises a cold cathode gas tube 27 and a current limiting resistor 29 connected in series. The heater for the cathode 15 of the tube 11 is connected to a suitable low voltage source $E_h$. The output of the tube in response to the low frequency input signals is sensed directly across the plate 13 and cathode 15 of the electron discharge tube 11 and can be taken from the terminals 31 and 33, as indicated in the drawing.

The cold cathode gas tube 27 is chosen so that its firing voltage is higher than the quiescent voltage between the plate 13 and the grid 17 of tube 11, plus the peak signal voltage appearing on the plate 13, plus the peak signal voltage appearing on the grid 17. The firing voltage for the cold cathode gas tube 27 must be less than the plate supply voltage $E_{bb}$ plus the negative voltage from the grid 17 to the cathode 15 which will stop the tube 11 from conducting.

During normal operation with low frequency input signals of normal amplitude being applied to the grid 17 of the tube 11, the cold cathode gas tube 27 is not conducting and the discharge circuit will have no effect on the electron discharge tube 11, except to increase slightly the grid to plate capacitance. When a large positive pulse appears at the grid of the electron discharge tube 11, the tube is driven to saturation as is the case with any conventional amplifier, resulting in an increase in the plate current, a decrease in the voltage at the plate, and grid current being drawn by the tube 11. The grid current must flow through the input coupling capacitor 25 since the tube 27 is not conducting. Consequently, a charge will build up on the capacitor 25 making the side connected to the input signal source positive and the side connected to the grid negative. When the positive pulse decays, the grid will be driven negative with respect to its normal operating value because of the charge on capacitor 25 which if of sufficient magnitude, may result in the amplifier being paralyzed. In the conventional amplifier the charge across the input coupling capacitor would leak off through a grid resistor and the time required for the amplifier to recover would depend upon the time constant of the input coupling network. In the amplifier of the present invention, when the grid is driven negative the plate current will decrease and the voltage at the plate will increase. When the voltage at the plate has increased a sufficient amount thus increasing the voltage across the cold cathode tube 27, the tube 27 will fire and current will flow through the capacitor 25 in a direction such as to charge positively the side of the capacitor connected to the grid and to charge negatively the side connected to the input source. This will cause the voltage on the grid to increase, the plate current to increase and the voltage at the plate to decrease. When the voltage at the plate has decreased a sufficient amount, voltage across the cold cathode gas tube 27 will decrease and cause tube 27 to be extinguished, and the amplifier will be again under normal operation.

Typical values of the components utilized in the amplifier of the present invention and providing very satisfactory results are as follows:

| | | |
|---|---|---|
| Tube **11** | | 5718 |
| Tube **27** | | NE–2 |
| $E_{bb}$ | volts | 90 |
| $E_h$ | do | 6.3 |
| Capacitor **25** | micromicrofarads | 1000 |
| Resistor **19** | ohms | 50,000 |
| Resistor **29** | do | 100,000 |

It will be readily appreciated by those skilled in the art that the length of time which the amplifier is paralyzed can be made extremely short, much shorter than in a high input impedance amplifier of conventional design, by the proper selection of the capacitor 25 and resistors 19 and 29. Since during normal operation the cold cathode gas tube 27 is inoperative and the bias on the tube 11 is such that the grid current is essentially zero, the resistive component of input impedance is very high. Since the input impedance to the grid 17 of the tube 11 is high, the value of the input coupling capacitor 25 can be low and still maintain a long coupling time constant.

While only one embodiment of the present invention has been shown and specifically described, it is realized that modifications and variations are possible and will be readily apparent to those skilled in the art from the foregoing description which is intended to be illustrative only and the scope of the invention is defined in the appended claims.

Having now particularly described my invention, what I desire to secure by Letters Patent of the United States and what I claim is:

1. An amplifier offering high impedance to a low frequency input signal source comprising an electron discharge tube having a plate, a cathode and a control grid, a source of plate supply voltage connected across said plate and said cathode, said cathode being connected to ground and maintained at ground potential, a capacitor connected in series with said input signal source and said grid of said tube for coupling said input signal source to said grid, circuit means including a cold cathode gas tube connected in series with said grid and said plate to provide a sole discharge path for said capacitor, and means connected in series with said plate supply voltage and said plate for rendering said gas tube conductive only when said amplifier is paralyzed as a result of a negative charge on said grid.

2. An amplifier offering high impedance to a low frequency input source comprising an electron discharge tube having a plate, a cathode and a control grid, a plate load resistor, a source of plate supply voltage connected through said plate load resistor across said plate and said cathode, said cathode being connected to ground and maintained at ground potential, a capacitor connected in series with said input signal source and said grid of said tube for coupling said input signal source to said grid, and a discharge circuit including a cold cathode gas tube and a current limiting resistor connected in series with said grid and said plate to provide a sole discharge path for said capacitor, the voltage drop across said plate load resistor rendering said gas tube conductive only when said amplifier is paralyzed as a result of a negative charge on said grid.

References Cited in the file of this patent

UNITED STATES PATENTS

| | | |
|---|---|---|
| 2,154,492 | Clough | Apr. 18, 1939 |
| 2,420,058 | Sweet | May 6, 1947 |
| 2,632,064 | Onia | Mar. 17, 1953 |